18#
United States Patent [19]

Weigold et al.

[11] Patent Number: 6,136,630
[45] Date of Patent: Oct. 24, 2000

[54] METHOD OF MAKING A MICROMECHANICAL DEVICE FROM A SINGLE CRYSTAL SEMICONDUCTOR SUBSTRATE AND MONOLITHIC SENSOR FORMED THEREBY

[75] Inventors: Jason W. Weigold; Stella W. Pang, both of Ann Arbor, Mich.

[73] Assignee: The Regents of the University of Michigan, Ann Arbor, Mich.

[21] Appl. No.: 09/325,204

[22] Filed: Jun. 3, 1999

Related U.S. Application Data

[60] Provisional application No. 60/087,986, Jun. 4, 1998.

[51] Int. Cl.⁷ .................................................. H01L 21/00
[52] U.S. Cl. ................................ 438/50; 438/51; 438/52; 438/53; 438/48
[58] Field of Search .................................. 438/50, 51, 52, 438/53, 48, 739, 734; 257/419

[56] References Cited

U.S. PATENT DOCUMENTS

| | | | |
|---|---|---|---|
| 5,719,073 | 2/1998 | Shaw et al. | 438/53 |
| 5,846,849 | 12/1998 | Shaw et al. | 438/52 |
| 5,847,454 | 12/1998 | Shaw et al. | 257/734 |
| 5,963,788 | 10/1999 | Barron et al. | 438/50 |

OTHER PUBLICATIONS

Yogesh B. Gianchandani, et al., "A Bulk Silicon Dissolved Wafer Process For Microelectromechanical Devices", Journal of Microelectromechanical Systems, Jun. 2, 1992, vol. 1. No. 2.

Wen–Han Juan, et al., "Released Si Microstructures Fabricated by Deep Etching and Shallow Diffusion", Journal of Microelectromechanical Systems, Mar. 1, 1996, vol. 5., No. 1.

R.R.A. Syms, et al., "Bulk Micromachined Silicon Comb–Drive Electrostatic Actuators With Diode Isolation", Sensors and Actuators, Sep. 1997, A 63, 61–67.

Richard J. Reay, et al., "Thermally and Electrically Isolated Single Crystal siliceon Structures in CMOS Technology", IEEE Electron Device Letters, Oct. 1994, vol. 15., No. 10.

M. Schneider, et al., "Integrated Micromachined Decoupled CMOS Chip on Chip", IEEE, 1997.

Kevin A. Shaw, et al., "Scream I: A Single Mask, Single–Crystal Silicon Process for Microelectromechanical Structures", School of Electrical Engineering and the National Nanofabrication Facility Cornell University, 1993.

(List continued on next page.)

*Primary Examiner*—Charles Bowers
*Assistant Examiner*—Hsien Ming Lee
*Attorney, Agent, or Firm*—Brooks & Kushman P.C.

[57] ABSTRACT

A monolithic sensor including a doped mechanical structure is movably supported by but electrically isolated from a single crystal semiconductor substrate of the sensor through a relatively simple process. The sensor is preferably made from a single crystal silicon substrate using front-side release etch-diffusion. Thick single crystal Si micromechanical devices are combined with a conventional bipolar complimentary metal oxide semiconductor (BiCMOS) integrated circuit process. This merged process allows the integration of Si mechanical resonators as thick as 15 $\mu$m thick or more with any conventional integrated circuit process with the addition of only a single masking step. The process does not require the use of Si on insulator wafers or any type of wafer bonding. The Si resonators are etched in an inductively coupled plasma source which allows deep trenches to be fabricated with high aspect ratios and smooth sidewall surfaces. Clamped-clamped beam Si resonators 500 $\mu$m long, 5 $\mu$m wide, and 11 $\mu$m thick are disclosed. A typical resonator had a resonance frequency of 28.9 kHz and an amplitude of vibration at resonance of 4.6 $\mu$m in air. Working NMOS transistors are fabricated on the same chip as the resonator with measured threshold voltages of 0.6 V and an output conductance of $2.0 \times 10^{-5}$ $\Omega^{-1}$ for a gage voltage of 4 V.

20 Claims, 7 Drawing Sheets

OTHER PUBLICATIONS

Theresa A. Core, et al., "Fabrication Technology For An Integrated Surface–Micromachined Sensor", Solid State Technology, Oct 1993.

James H. Smith, et al. "Intelligent Microsystems: Strategy For The Future", Semiconductor International, Apr. 1998.

Timothy J. Brosnihan, et al., "Embedded Interconnect and Electrical Isolation For High–Aspect–Ratio, SOI Inertial Instruments", IEEE, 1997.

Yogesh B. Gianchandani, et al., "A CMOS Dissolved Wafer Process For Integrated P++ Microelectromechanical Systems", Center For Integrated Sensors and Circuits, University of Michigan, 1995.

Changhyun Kim, et al., "A 64–site Multishank CMOS Low–Profile Neural Stimulating Probe", 1996.

Osamu Tabata, et al., "Monolithic Pressure–Flow Sensor", IEEE Transactions on Electron Devices, Dec. 12, 1987, vol. ED.34, No. 12.

Fig. 9d n-Si
p++Si
HIGH TEMPERATURE SiO₂

METHOD OF MAKING A MICROMECHANICAL DEVICE FROM A SINGLE CRYSTAL SEMICONDUCTOR SUBSTRATE AND MONOLITHIC SENSOR FORMED THEREBY

CROSS-REFERENCE TO RELATED APPLICATION

This application is based on and claims benefit of U.S. Provisional Patent Application Ser. No. 60/087,986, filed Jun. 4, 1998 and entitled "Merged Circuit And Micromechanics Process For Thick Single Crystal Si Micromechanics."

GOVERNMENT RIGHTS

This invention was made with government support under Contract No. DABT 63-C-0111, awarded by the Defense Advanced Research Projects Agency (DARPA). The government has rights in the invention.

TECHNICAL FIELD

This invention relates to methods of making micromechanical devices from single crystal semiconductor substrates and monolithic sensors formed thereby.

BACKGROUND ART

The advantages of using single crystal semiconductors such as Si as a mechanical material have long been recognized. For example, its strength and high intrinsic quality factor make it attractive for micromechanical resonant devices. It is readily available as an integrated circuit (IC) substrate and can be processed using methods developed by the IC industry.

Thick Si devices also can have advantages over thinner ones for many applications. When capacitive transduction is used to drive or sense motion in a micromechanical device, large capacitive plates with small gaps between them are desired to increase capacitance so that high sensitivity can be achieved. For laterally resonant devices, this translates into a thick structure. Thick structures can also be advantageous for inertial sensing applications where large masses are required to respond to small inertial forces.

One of the obstacles in the production of single crystal Si micromechanical devices has been the ability to integrate electrical circuitry with the micromechanics using a simple fabrication process. Integration of circuitry with micromechanics can provide a number of advantages for many sensing and signal processing applications. Often the output of micromechanical devices is a very small electrical signal. The difficulty in reading out a small output signal can limit the sensitivity or signal-to-noise ratio in many devices. This signal is usually buffered or amplified so that it can then be processed by the rest of the electronic system. When the signal processing is done on a separate chip from the micromechanics, the signal must travel through bond pads, bond wires, and external packaging structures which have large parasitic capacitances associated with them. This further limits the signal which can be read out. However, if the signal processing circuitry can be included on the same chip as the micromechanical structure, smaller signals can be amplified and conditioned, and even converted to digital signals so that when they are passed off chip, they are not degraded significantly by off-chip parasitics.

A number of technologies have been developed which integrate micromechanics and electrical circuitry. Many use surface micromachined polycrystalline Si micromechanical elements due to this material's availability, often used as transistor gates, in electrical circuitry. The use of thin polycrystalline Si layers provides flexibility in geometry, transducer axis selection, anchoring, and number of structural layers.

However, the use of polycrystalline Si brings with it some limitations in design. Polycrystalline Si is typically deposited at relatively high temperatures. As such, when it cools down to room temperature, stress gradients developed in the film due to mismatches in thermal expansion coefficient can cause a released micromechanical device to bend. Therefore, deposition conditions must be carefully selected and monitored in order to produce a polycrystalline film with low stress. Also, film thicknesses are typically limited to a few micrometers due to the long depositions times. However, recent work has demonstrated that thick polycrystalline Si films can be grown in acceptable times with useful properties.

There are various processes used to fabricate single-crystal Si micromechanical devices but most are difficult to integrate with conventional circuit processes, or expensive Si on insulator (SOI) starting wafers are required. There have been a number of successful efforts to integrate single crystal Si micromechanical structures with conventional circuitry and all have several advantages and drawbacks.

DISCLOSURE OF INVENTION

An object of the present invention is to provide a method of making a micromechanical device from a single crystal semiconductor substrate using frontside release diffusion-etch or etch-diffusion and a monolithic sensor formed thereby without the need for wafer bonding.

Another object of the present invention is to provide a method of making a micromechanical device from a single crystal semiconductor substrate which device is integrated with conventional semiconductor circuitry with the addition of only a single standard masking step. The device may be a monolithic sensor such as a single crystal Si laterally resonant device.

This process has many advantages over other processes including the use of standard Si starting wafers as opposed to expensive silicon on insulator or exotic starting wafers. Also, this process requires no wafer bonding, no backside processing or backside alignment of the micromechanical structure, and no electrochemical etch stop for the release etch in ethylenediamine pyrocatechol (EDP).

In carrying out the above objects and other objects of the present invention, a method is provided of making a micromechanical device from a single crystal semiconductor substrate. The method includes the steps of: a) introducing a dopant into a portion of the substrate from the first surface; and b) selectively removing unwanted substrate material from a first surface of the substrate. At least one doped mechanical structure is formed after performing steps a) and b). The method further includes selectively removing undoped substrate material from the first surface of the substrate to release the at least one doped mechanical structure. The at least one doped mechanical structure is movably supported by but electrically isolated from the substrate.

The at least one doped mechanical structure may be a resonator.

Preferably, the method further includes the step of forming circuitry on the substrate.

Still, preferably, the circuitry includes bipolar circuit elements and/or MOS circuit elements.

Further in carrying out the above objects and other objects of the present invention, a method of making a suspended microstructure from a single crystal semiconductor substrate is provided. The method includes the steps of: a) introducing a dopant into a region in the substrate; b) depositing a masking material over the region; c) selectively removing the portions of the masking material to form a mask; d) selectively removing sections of the region using dry etching and the mask, wherein a doped microstructure is formed after performing steps a) through d); e) selectively removing material from the substrate with an etch which etches the substrate but does not etch the doped microstructure, so that the doped microstructure is movably supported by but electrically isolated from the substrate; and f) removing the masking material.

Step f) may be performed before step e).

Steps b) through d) may be performed before step a).

The mask may be a metal mask, a silicon dioxide mask, a photoresist mask or other mask.

The diffused doped region may be greater than 7 $\mu$m thick so that the microstructure is also greater than 7 $\mu$m thick or the diffused doped region may be less than 7 $\mu$m thick so that the microstructure is also less than 7 $\mu$m thick.

The step of introducing the dopant forms an electrically isolating diode between the doped microstructure and the substrate. Alternatively, the microstructure may be isolated from the substrate by: g) dry etching a trench around anchors of the doped microstructure; and h) refilling the trench with an insulating material such as silicon dioxide film to anchor the doped microstructure to and electrically isolate the doped microstructure from the substrate as illustrated in FIGS. 9a through 9d.

The length of the releasing etch of step e) is variable in order to increase or decrease the distance between the suspended doped microstructure and the substrate.

The dry etching of step d) may be done in an electron cyclotron resonance source, an inductively coupled plasma source or other plasma sources.

The etch of step e) may be done using ethylenediamine pyrocatechol, potassium hydroxide, TMAH (tetramethyl ammonium hydroxide), or others.

Still further in carrying out the above objects and other objects of the present invention, a monolithic sensor is provided. The sensor includes a single crystal substrate, a doped microstructure movably supported by but electrically isolated from the substrate for sensing a condition. The sensor also includes circuitry formed on the substrate and coupled to the doped microstructure for resolving a signal based on the sensed condition.

The circuitry may include bipolar circuit elements and/or MOS circuit elements.

The doped microstructure may be fabricated by any of the above methods with the circuitry formed after step a) and before step b).

Yet still further in carrying out the above objects and other objects of the present invention, a method of making a suspended microstructure from a single crystal semiconductor substrate is provided. The method includes: a) selectively removing unwanted substrate material from a first surface of the substrate, and b) introducing a dopant into a portion of the substrate from the first surface. At least one doped mechanical structure and an open area surrounding the mechanical structure are formed after performing steps a) and b). The method further includes: c) refilling the open area surrounding the mechanical structure with a material; d) forming semiconductor circuitry on the substrate; and e) removing the material surrounding the mechanical structure. The at least one doped mechanical structure is movably supported by but electrically isolated from the substrate.

A merged circuit and micromechanics process of the invention allows integration of micromachined thick single crystal Si structures with a conventional circuit process with the addition of only a single mask. This provides the benefit of using on-chip signal conditioning circuitry to perform a variety of functions in combination with mechanics, without having to move the signal off-chip where its integrity can be compromised due to parasitics. This process could be used for a variety of devices including high performance, inexpensive accelerometers, gyroscopes, signal processing elements and various other types of sensors.

The use of single crystal Si provides excellent mechanical properties. Since the material is a single crystal, intrinsic stress in the film is minimized as compared to polycrystalline Si which is normally used as a structural material. Also, the high intrinsic material quality factor allow excellent mechanical devices to be fabricated.

This process allows single crystal Si mechanical structures with thicknesses up to 15 $\mu$m or more to be fabricated. These thick structures can provide a large mass which can increase sensitivity to inertial forces. Also, this increased thickness can provide increased area for capacitive plates used for driving and sensing motion of the mechanical structure. This mechanical structure is anchored directly to the Si substrate with a continuous material and therefore, energy loss due to dissipation of energy in anchors is negligible and high quality factors can be obtained. In addition, the quality factor of laterally resonant structures are typically limited by Couette or Stoke's type damping which is decreased by increasing the gap between the structure and the substrate. Since this gap can be arbitrarily varied in this process, and can be made large (greater than 50 $\mu$m compared to typical gaps of 1–2 $\mu$m on standard processes) this type of damping is minimized and high quality resonators can be fabricated.

Since this process adds only a single masking step to a conventional circuit process, devices can be fabricated inexpensively. Conventional circuit processes are very well developed and complex circuitry can be fabricated with high yields at very low cost. Typical yield problems associated with micromechanics are also minimized with this process. Since the structures can be made thick, they can be designed to be very stiff in the direction out of the plane of the chip. This makes them immune to stiction in the vertical direction which can cause failure in typical micromechanical devices. In addition, the separation between the device and the substrate is large, further preventing stiction to the substrate. Because of this resistance to stiction, standard wet release processing can be used and drying at the critical point or bridge structures are not required for successful release. Also, the thick devices are more robust than thinner devices and therefore are not as easily damaged during processing. This resiliency to typical failure mechanisms allow devices to be fabricated with high yields which reduces cost in the batch fabrication process inherent to the integrated circuit industry.

Devices have been fabricated using this process and verification of the operation of mechanical as well as electrical devices has been performed. Clamped-clamped beam comb drive resonators have been tested and excited at their resonant frequency. In addition, the transistor current-voltage (I-V) characteristics of metal oxide field effect transistors (MOSFETs) have been measured on the same chip as the resonant mechanical device.

The above objects and other objects, features, and advantages of the present invention are readily apparent from the following detailed description of the best mode for carrying out the invention when taken in connection with the accompanying drawings.

BRIEF DESCRIPTION OF DRAWINGS

FIGS. 4a and 4b are graphs illustrating characteristics of the diode formed between a heavily B-doped resonator and the lightly doped substrate.

BEST MODE FOR CARRYING OUT THE INVENTION

Referring now to the drawing figures, FIGS. 1a–1g show a schematic of the process flow used to fabricate micromechanical devices such as resonators and, in particular, resonators integrated with circuitry. However, it is to be understood that other micromechanical devices could be formed by the process such as accelerometers.

Figure 1A:
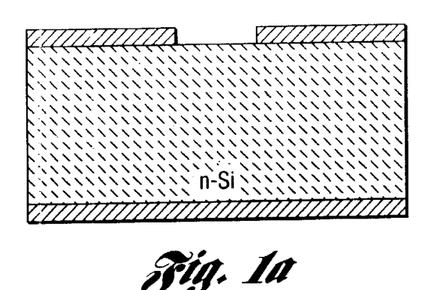
FIGS. 1a–1g are schematic views of a merged process used to fabricate thick single crystal Si resonators and BiCMOS circuitry of the present invention.

First a thermal oxide (i.e. $SiO_2$) is grown on an n-Si wafer to be used as a mask for subsequent long diffusion (FIG. 1a). Alternatively, a nitride ($Si_3N_4$) mask may be formed.

Figure 1B:
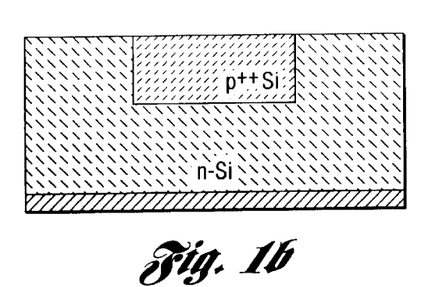

B (i.e. boron) diffusion is performed which is ~15 μm deep or more and forms a micromechanical structure and serve as an etch stop for the EDP release (FIG. 1b). The diffusion used is preferably isolation diffusion from the bipolar part of a CMOS circuit process described below. This diffusion can be used as long as the doping concentration is made high enough (>$7\times10^{19}$ cm$^{-3}$) to serve as an etch stop in the EDP release etch but will result in an increased collector-to-substrate capacitance ($C_{CS}$). If a CMOS circuit process is used or a minimization of $C_{CS}$ is important, a long B diffusion is added before the beginning of the CMOS circuit process. This diffusion defines the thickness of the micromechanical structure, which is limited to about 15 μm for practical diffusion times.

Figure 1C:
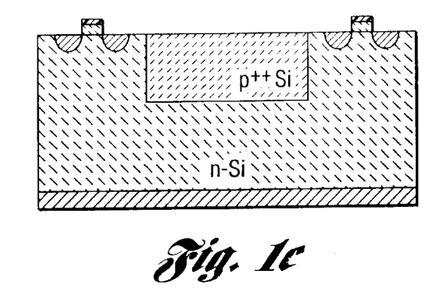

Next, conventional circuit processing is done (FIG. 1c). Since all that has been done to this point is a diffusion, the starting condition of the wafers for the CMOS circuit is planar. The CMOS circuit process used herein is a BiCMOS process with a 3 μm gate length, 2 levels of polycrystalline Si, and 1 metal layer. Other bipolar, CMOS, or BiCMOS processes with different device dimensions can also be implemented.

Figure 1D:
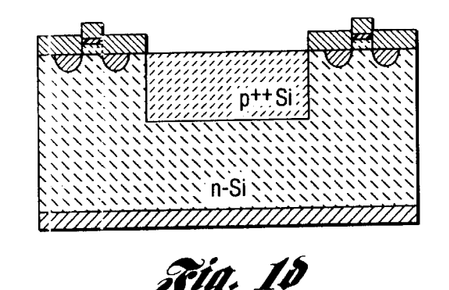

Following the circuit fabrication, a low temperature oxide (LTO) layer is deposited on top of the circuit for passivation as well as to protect it from the subsequent EDP release etch (FIG. 1d).

Figure 1E:
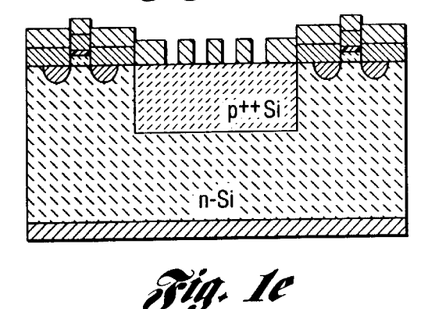
Figure 1F:
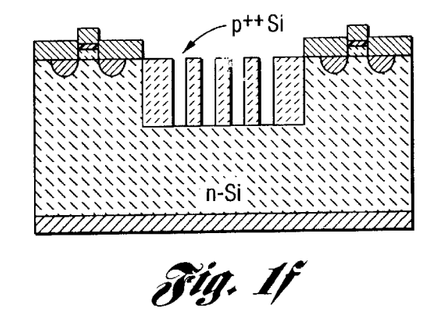

Following the LTO layer, a 25/5 nm Ti/Ni plating base is evaporated over the entire wafer. A 2.8 μm thick photoresist is then patterned on top of the plating base which will serve as a plating mold. 2 μm of Ni is electroplated through the mold and the mold is then removed. The plated Ni serves as a dry etch mask for the deep Si etch which follows (FIG. 1e). Other etch masks such as a dielectric or photoresist mask can also be used.

The dry etch can be done in an inductively coupled plasma (ICP) source with 250 W source power and 70 W stage power at 5 mTorr with 20 sccm of $Cl_2$ flow and a source-to-sample distance of 6 cm. This dry etch goes completely through the B layer so that separate B-doped elements are formed. The Ni mask is then removed in boiling HCl.

Figure 1G:
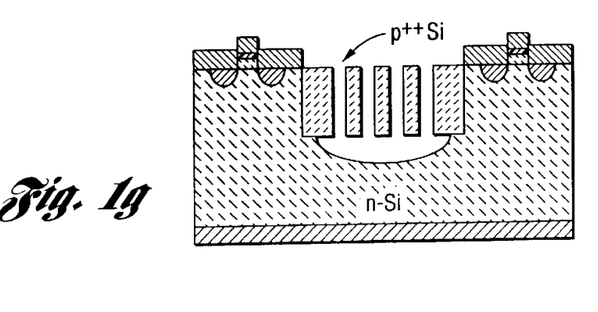

The samples are then etched in EDP for about 20 minutes in order to undercut the B-doped structures and release the micromechanical devices (FIG. 1g). The EDP solution selectively etches the lightly doped Si and electrical contact to the wafer is not needed during the wet etch. Also, since the circuitry is protected from the EDP solution by the LTO, no special fixtures or waxes are required to hold the wafers during etching. Although an EDP release etch was used in these experiments, any Si etchant which is selective to heavy B doping can be used. Release of the structure can be achieved by etching of Si with alkali hydroxide etchants such as KOH. KOH is easier to handle than EDP but contains alkali ions which can be detrimental to MOS transistors. Quaternary ammonium compounds which are free of alkali ions have also been used to etch Si with good etch characteristics. A B etch stop has been reported in a tetramethyl ammonium hydroxide (TMAH) solution and an etch ratio of 1:40 has been achieved between heavily and lightly B-doped Si. Using the above process, clamped-clamped beam resonators are fabricated with on-chip transimpedance amplifiers. The devices were resonated and their resonance characteristics were measured both optically and electrically.

Results and Discussion

Process Integration

Figure 2:
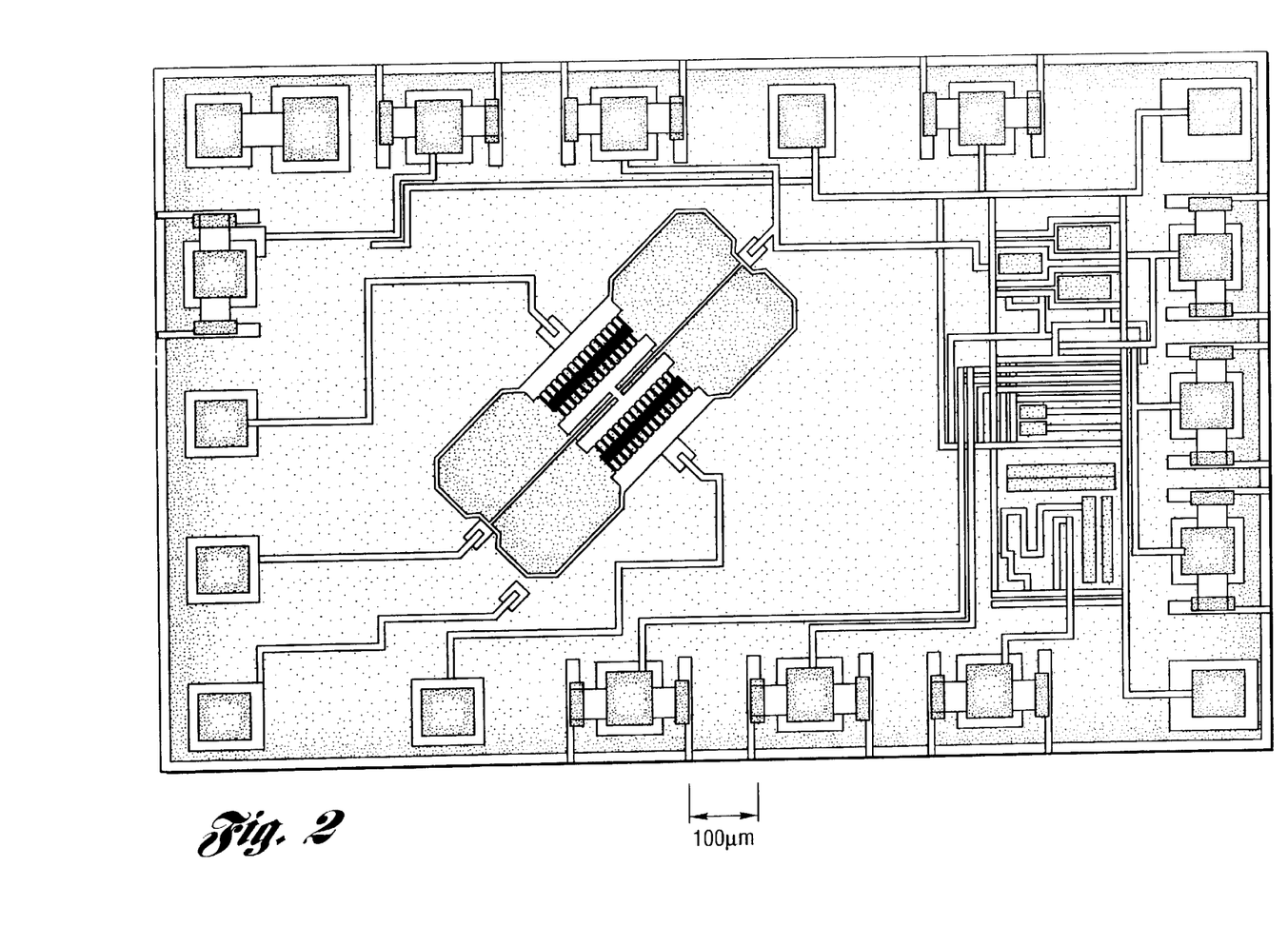
FIG. 2 is a top plan view of the die containing an 11 μm thick Si resonator and a CMOS transimpedance amplifier.

FIG. 2 is a top plan view of the resonator integrated with the transimpedance amplifier. There are two important points to note about the order of steps in this merged fabrication process. Thermal concerns are often a limiting factor when micromechanics are to be integrated with circuitry. In other processes with polycrystalline Si micromechanical structures, deposition and annealing temperatures of polycrystalline Si are typically higher than conventional Al metallization can withstand. Therefore, processing of mechanical polycrystalline Si layers must be done before the Al metallization steps.

In the process developed in this work, the B diffusion used to form the micromechanical structure here is a long, high temperature step and therefore is done before Al interconnects are formed on the wafer. Also, if the transistor junctions are already formed, this diffusion would diffuse them much further, which would ruin the transistors. Therefore, it is advantageous to perform the long B diffusion before any circuit processing has been done.

Another concern when integrating micromechanics and circuitry is topography. Micromechanical structures often have large steps compared to circuit features and these steps can be hard to conformably protect with thin films. In the process presented here, the deep dry etch forms deep trenches in the Si wafer. It is difficult to obtain uniform photoresist coatings in deep trenches and even if adequate films are obtained, complete removal of the photoresist from the high aspect ratio trenches is difficult. Unless the trenches are somehow filled or encapsulated and planarized, the circuit processing would be difficult with these large steps. Therefore, the dry etch is done after the circuit processing. The two limitations of the high-temperature B diffusion and the deep trenches determine that the circuit processing should be done after the diffusion and before the deep dry etch to keep the merged process simple.

An alternative method could be carried out by first dry etching to form deep trenches, followed by diffusion and trench refill before the circuit processing. Schematics of this method are shown in FIGS. 8a–8f.

The resonator on the left side of the die shown in FIG. 2 was rotated at a 45° angle relative to the manhattanized circuit layout. The reason for this rotation is to shorten the EDP release etch. If the resonator was not rotated, the etch rate of Si in EDP would slow down at the (111) planes and then proceed to undercut the resonant elements at a very slow rate. Resonators can still be released without rotation, at the expense of a longer release etch time. However, if the resonators are rotated 45°, the EDP can undercut the resonant elements at a faster rate since the slow etching planes do not run parallel to the resonators. This way, large resonant elements can be undercut in short periods of time. These resonators were fully released with only a 10 min EDP etch. On the right side of FIG. 2 is the transimpedance amplifier and on the periphery of the chip are electrostatic discharge protected bond pads for outside electrical connection to the circuit and micromechanical structure.

The gap between the released Si resonator and the substrate can be arbitrarily varied by changing the EDP release etch time. In most cases, a large gap between the resonator and substrate is desirable. The voltage difference between the moveable resonator and the substrate can cause static displacement of the resonator which can affect device operation. A large gap decreases the coupling of energy between the substrate under the resonator and the resonator itself. For surface micromachined devices operated in air, the quality factor of the resonator is often limited by energy dissipation due to Couette or Stoke's type damping between the structure and the substrate. This is due to the small gap often created when a thin sacrificial layer is used. Since the gap can be made much larger in this work, the quality factor in air of these devices is probably not limited by Couette or Stoke's type damping beneath the structure, but rather, may be limited by damping in between the thick plates of the comb structure.

Si Etching in an Inductively Coupled $Cl_2$ Plasma

One of the enabling steps in this process is the deep Si etch used to etch through the B doped Si layer and define the micromechanical structure. High density plasma sources allow high aspect ratio trenches to be etched easily and reliably. The plasma etch system used for dry etching consists of an ICP source and an rf powered electrode. Power was inductively coupled into the plasma through a 4 turn solenoid type copper coil with input power from 0 to 2000 W at 2 MHZ. The rf powered stage coupled energy into the plasma at 13.56 MHZ with power available from 0 to 500 W. This stage power serves to bias the wafer and accelerate ions to the wafer surface causing anisotropic etching. The rf power or the self induced dc bias ($|V_{dc}|$) on the wafer can be controlled. The ICP source to sample distance was fixed at 6 cm. Gas flows were regulated with mass flow controllers, and the chamber pressure was controlled by a throttled 1500 l/s turbomolecular pump. All dry etching of Si was done at room temperature and no cryogenic cooling of the wafer is necessary.

An optimized etch condition was developed in order to etch Si trenches with minimum feature sizes of 1 $\mu$m and depths >50 $\mu$m. A source power of 250 W, stage power of 70 W, and $|V_{dc}|$ of 176 V at 5 mTorr with 20 sccm $Cl_2$ flow was used. Chlorine etching of Si relies on an ion assisted reaction for etching to proceed. The chlorine etch species will not spontaneously etch Si so that very little undercutting is expected. The etching only proceeds when directional ions bombard a layer of adsorbed $SiCl_x$ species on the surface of the Si. This bombardment provides the energy for the etch products to desorb and for etching to proceed. When Si is etched in a $Cl_2$ plasma at low pressure, passivation or polymerization of sidewalls is not needed to achieve a vertical etch profile.

A number of high density plasma systems can be used to etch the thick Si resonators. An ECR source has been used previously to etch deep trenches with high aspect ratios and vertical profiles. In addition, commercially available high density ICP systems have been optimized to etch deep trenches in Si. Most of these processes rely on cycling between etching with fluorine containing plasmas and depositing or coating sidewalls with polymers. High selectivity to a $SiO_2$ or photoresist mask was achieved. The use of passivation of sidewalls can limit the etching of narrow trenches. For narrow trenches, sidewall coatings can plug the trenches, preventing etching, and making the process hard to control. Also, processes which rely on passivation of sidewalls typically are performed at higher pressures (>10 mTorr) This makes microloading or aspect ratio dependant etching effects worse, due to the difficulty in transporting etch species and products in and out of high aspect ratio trenches. On the other hand, the metal mask used in this work adds one additional masking step to the circuit process, but it allows high aspect ratio resorant elements to be formed with small gaps, vertical profiles, smooth sidewalls, and minimal microloading effects. If a photoresist or $SiO_2$ mask is used, the merged process can be further simplified since the circuit passivation mask could be used to define the micromechanical structure and no additional masking steps other than the circuit steps are required.

Resonator Characteristics

Figure 3A:
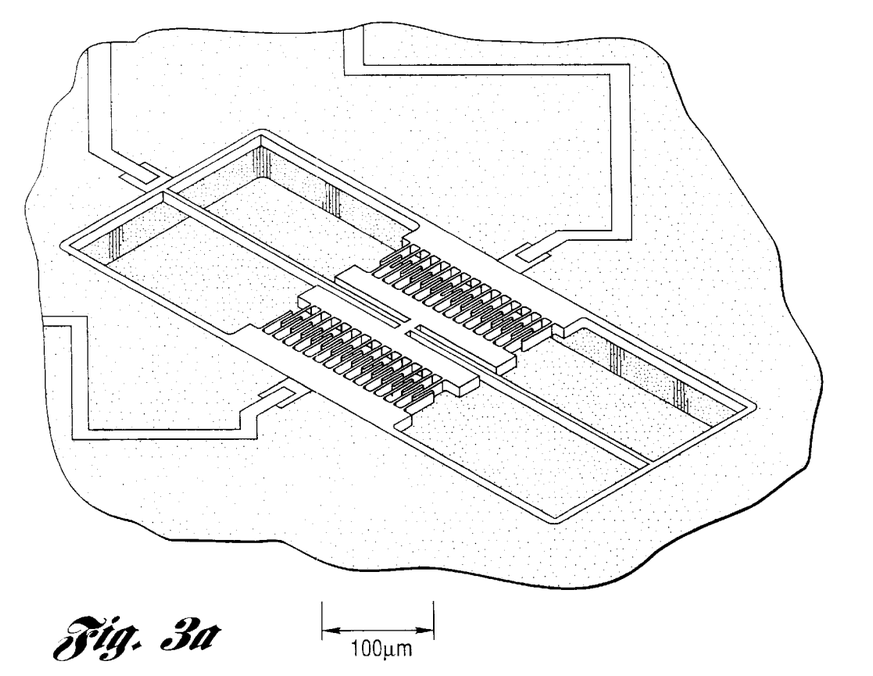
FIGS. 3a and 3b are schematic, broken away views of an 11 μm thick, 500 μm long, 5 μm wide clamped-clamped beam resonator with metal lines connecting the resonator to circuitry and a close-up of the electrostatic comb drive showing the high aspect ratio gaps between fingers etched in an inductively coupled plasma source, respectively.

A clamped-clamped beam micromechanical resonator was fabricated using this merged process as shown in FIG. 3a. The beam is 500 $\mu$m long, 5 $\mu$m wide, and 11 $\mu$m thick. Motion is driven and sensed using capacitive-comb transducers with 3 $\mu$m wide fingers and 3 $\mu$m wide gaps. The resonant elements are released from the substrate by etching in EDP and the Al metal lines connecting the resonator to the circuit can also be seen.

Figure 3B:
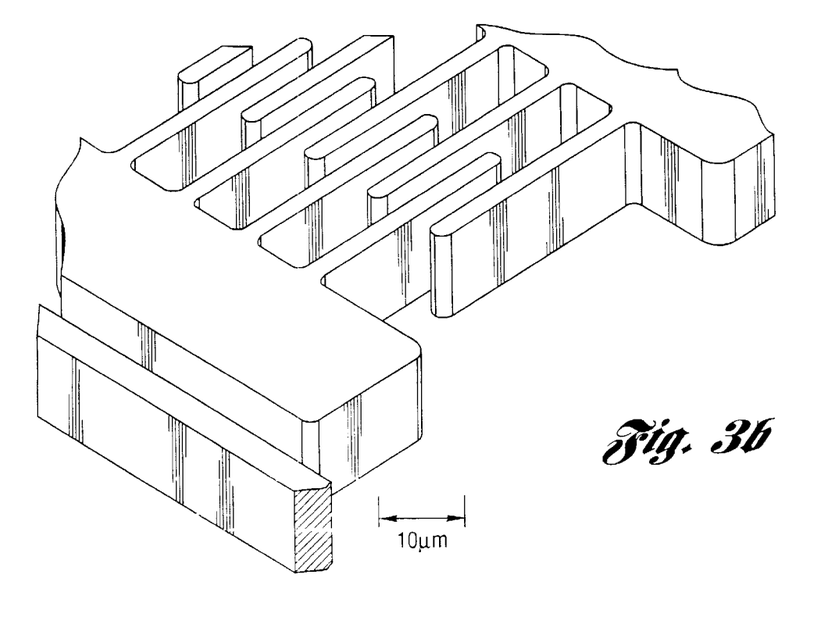

A close-up of the resonator is shown in FIG. 3b. The high aspect ratio achievable by dry etching can be seen between the comb fingers. Also, a very smooth surface is obtained on all sidewalls. The deep Si etching in a $Cl_2$ plasma provides a very smooth surface and the EDP etch further smooths the surface of the B doped Si.

The Si resonant elements must be isolated from the substrate so that potentials can be applied between the different micromechanical elements. This is another major challenge in the integration of single crystal Si structures on a conventional Si substrate. In this work, p-n diode isolation is used so that current will not flow from the resonator into the substrate. The diode is formed between the heavily doped $p^{++}$ micromechanical structure and the highly doped-substrate. As long as this diode is kept reverse biased, only leakage currents will flow to the substrate and large voltages can be placed across the micromechanical structure.

Figure 4A:
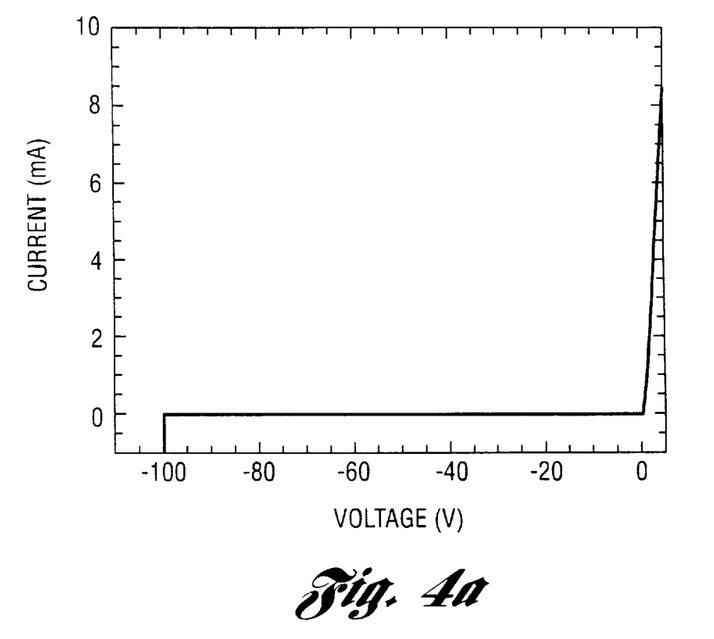
FIG. 4a shows forward and reverse characteristics showing a breakdown voltage of −99.2 V.
Figure 4B:
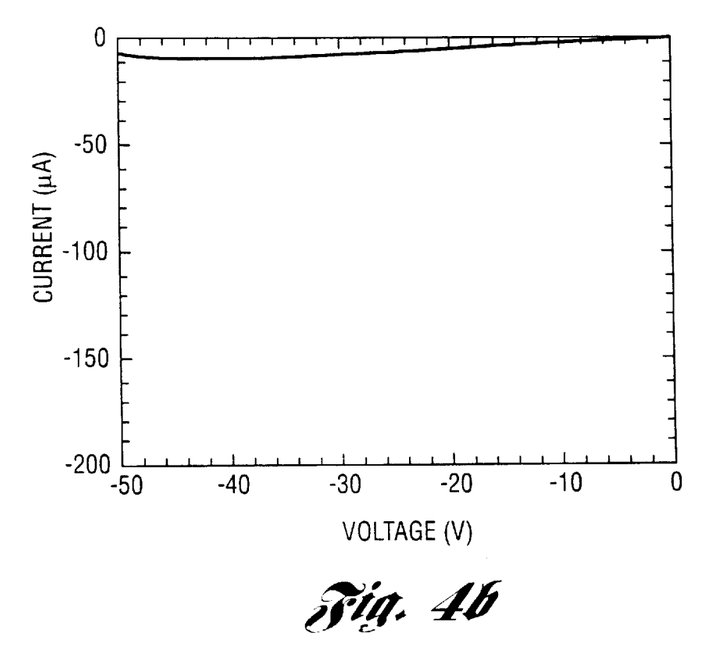
FIG. 4b shows average reverse current of 5.38 μA; reverse current at −50 V=6.26 μA.

The diode characteristics are shown in FIGS. 4a and 4b for the resonator integrated with circuitry on the die shown in FIG. 2. There are a few very important parameters of this diode which affect the performance of the device. The reverse breakdown voltage limits the magnitude of the dc voltage which can be placed across the drive and sense ports of the resonator.

FIG. 4a shows that the diode breaks down at −99.2 V which is typical of the diodes fabricated with this process. This allows large dc biases to be placed across the drive and sense ports of the resonator.

Another important diode parameter is the reverse leakage current. While the diodes are reverse biased, a dc leakage current will flow across the junction. This is undesirable and will consume power, so low reverse currents are required. FIG. 4b shows that the reverse current for these diodes is 6.26 $\mu$A at a −50 V dc bias with an associated power consumption of [18] 300 $\mu$W. One last consideration is the junction capacitance inherent in a p-n junction diode. This capacitance may limit high frequency performance of the resonators. However, since the devices are strongly reverse biased with large negative voltages and the doping in the lightly doped substrate is low, the depletion region should be large and junction capacitance should be relatively low. Since the junctions are exposed on the surface of the devices, this may lead to undesirable characteristics such as leakage currents across the exposed junction as well as instability, low reproducibility, and added breakdown mechanisms. These junctions can be passivated easily by growing a thin oxide on the structure or using one of the many thin films being investigated for passivation of micromechanical structures.

Although p-n junction isolation is used in this work, this merged process is not limited to this isolation scheme. The use of the junction isolation provides excellent anchoring of the resonator through a continuous single crystal Si substrate. That is, there is no interface between dissimilar materials other than B doped Si and lightly P doped Si which may decrease temperature sensitivity of the resonant structure. However, the drawbacks of junction isolation as mentioned above may make other isolation methods more desirable for certain applications, such as high frequency micromechanical resonators for signal processing. In this case, a single masking step can be added to the merged process to obtain dielectric isolation. A trench can be etched in the Si at the beginning of the process and refilled with a dielectric. This would isolate the resonator from the substrate as well as provide mechanical anchoring of the resonator to the substrate.

Figure 5:
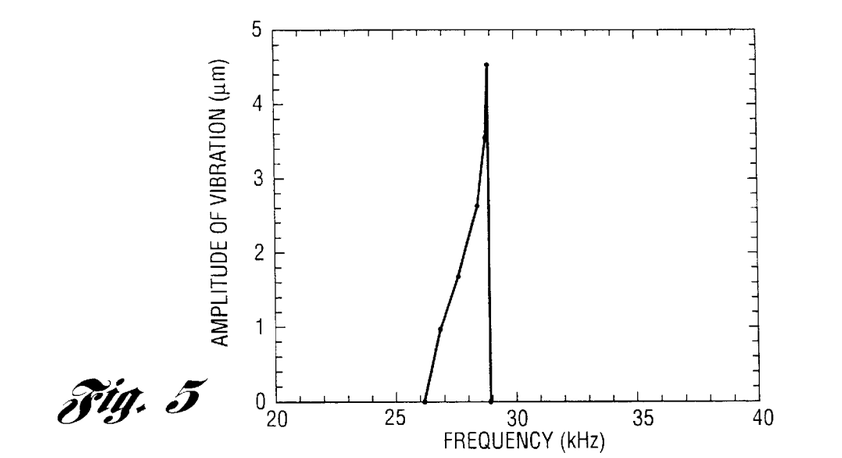
FIG. 5 is a graph illustrating resonance characteristics of the resonator of FIG. 2 measured optically in air with a 50 V dc bias and a 10 $V_{p-p}$ ac excitation.

The resonance characteristics of the resonators have been measured both optically and electrically. FIG. 5 shows the resonance characteristics of the clamped-clamped beam resonator measured optically in air. A dc bias of 50 V was placed across the comb drive and an ac excitation of 10 $V_{p-p}$ was used to drive the structure into resonance. The resonance frequency was 28.85 kHz and the maximum amplitude of vibration at resonance was 4.6 $\mu$m. The ac signal was scanned from low to high frequencies for these measurements. The vibration amplitude drops off quickly after resonance because the resonator was overdriven. A large amplitude of vibration was desired in order to measure the vibration with minimal errors. Therefore, the highest driving voltages possible without pull-in were used. The resonance characteristics were also measured electrically using an HP4195 network analyzer. Since the output signal was measured as a current, low driving voltages could be used. A 25 V dc bias and a 1.26 $V_{p-p}$ ac voltage were used to drive the resonator. A symmetric resonance curve was measured when the driving voltages were reduced and the vibration amplitude was measured electrically with the network analyzer.

Figure 6:
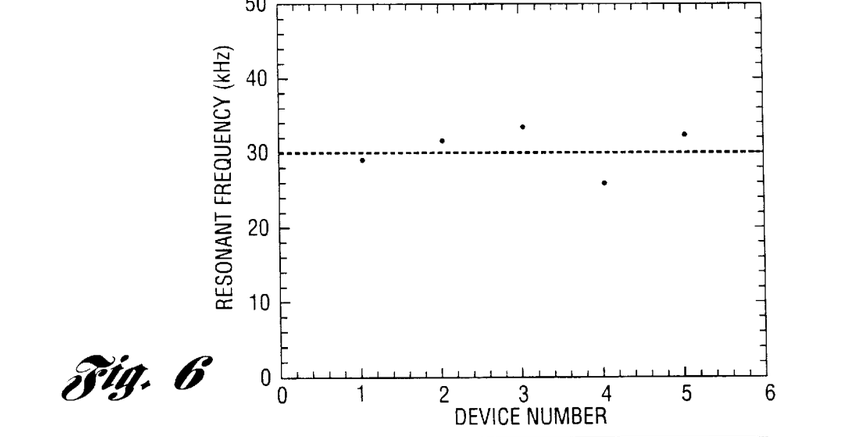
FIG. 6 is a graph illustrating proximity of measured resonance frequency to that predicted by conventional beam theory for five different samples constructed in accordance with the present invention.

A number of devices were measured in order to determine the reproducibility of the process. The resonance frequency of five typical resonators is shown in FIG. 6 and compared to a theoretical calculation. A predicted resonance frequency of 30.02 kHz was calculated from the geometry of the resonator and material constants as follows:

$$f_o = \frac{1}{2\pi}\sqrt{\frac{k}{m}}$$

where k is the spring constant and m is the mass of the resonator. A Young's modules of 150 GPa and a Si density of 2330 kg/m$^3$ was assumed. The mass of the resonator based on the designed device dimensions was 4.31×10$^{-10}$ kg. All the measured devices had resonance frequencies close to that predicted by the calculations. The average resonance frequency across a 4" dia. Si wafer was within 0.5% of the predicted frequency. This indicates that the dimensions of the resonators can be tightly controlled and are uniform across a four inch wafer.

Integrated Circuit Performance

Figure 7:
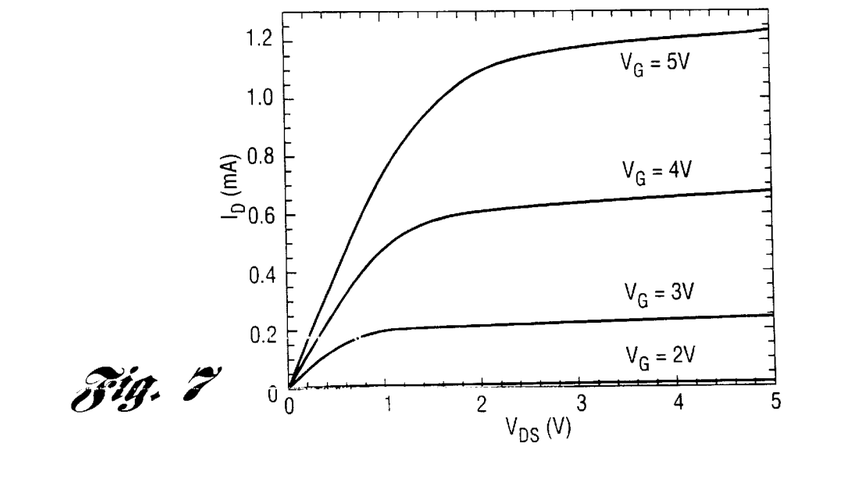
FIG. 7 is a graph of an I-V curve for an NMOS transistor measured after all micromechanical processing; the threshold voltage is 0.6 V and the transistors have a $V_A$ of 40.8 V.
Figure 8A:
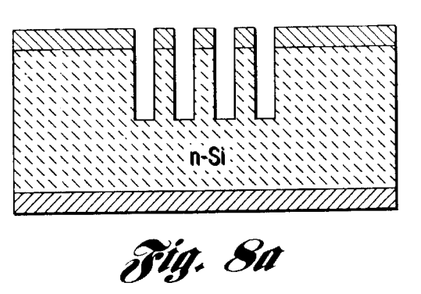
FIGS. 8a–8f are schematic views of an etch-diffusion process used to fabricate thick single crystal Si resonators and BiCMOS circuitry of the present invention.
Figure 8B:
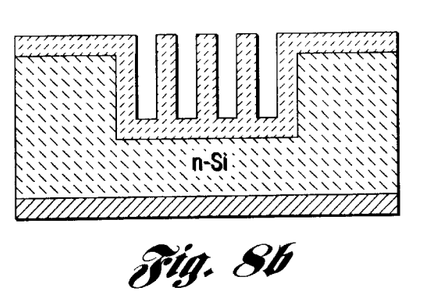
Figure 8C:
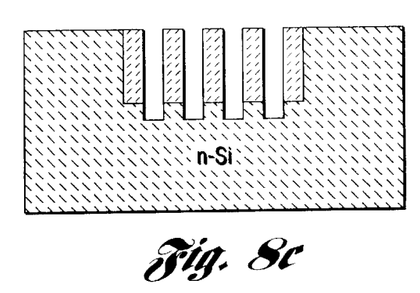
Figure 8D:
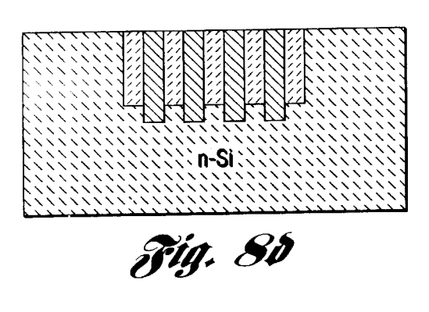
Figure 8E:
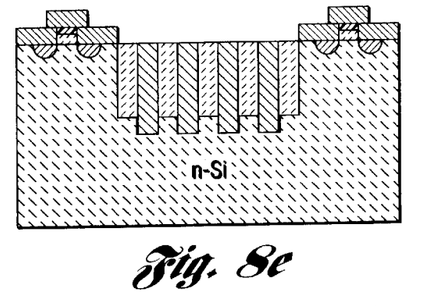
Figure 8F:
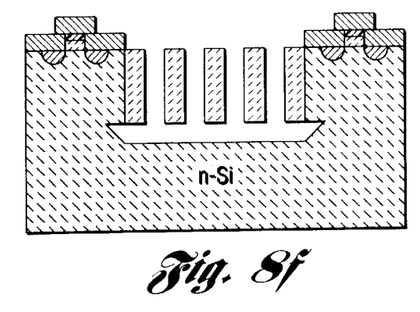
Figure 9A:
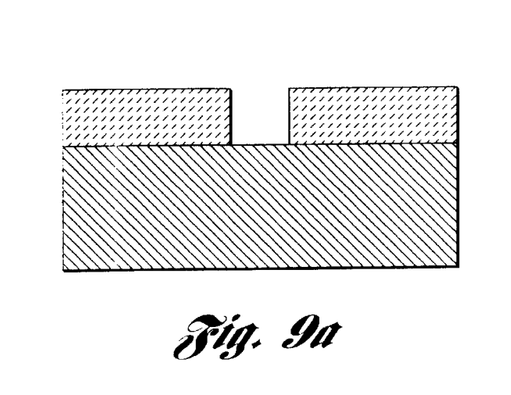
FIGS. 9a–9d are schematic views of a method used to electrically isolate but mechanically and movably support a micromechanical structure using a trench refilled with a dielectric material.
Figure 9B:
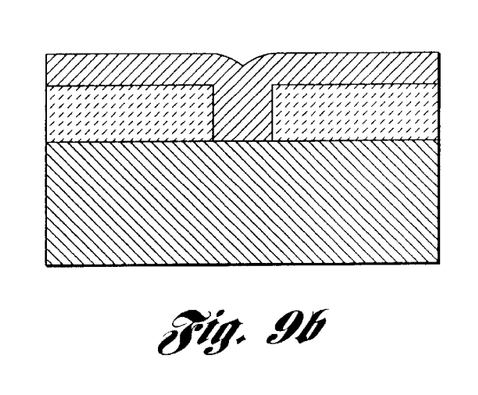
Figure 9C:
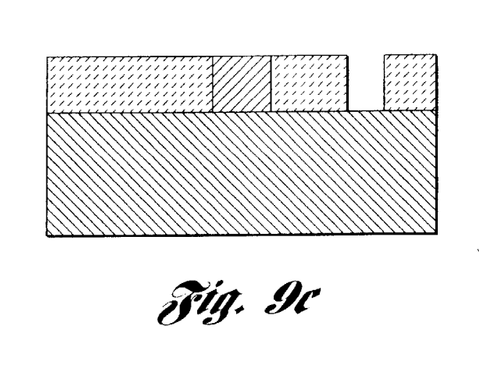
Figure 9D:
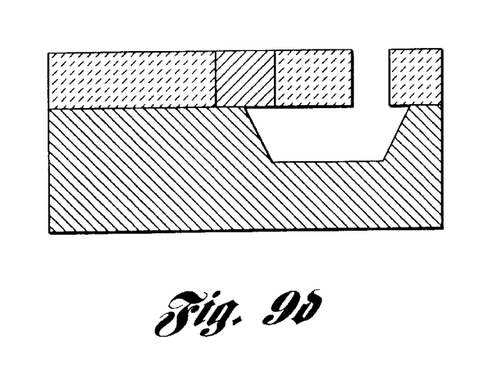

The performance of the circuitry was measured after all processing was finished in order to determine if the processing of the micromechanical structure had any effect on circuit performance. A current-voltage (I-V) curve measured using an HP4145 semiconductor parameter analyzer for an n-channel metal oxide semiconductor (NMOS) transistor is shown in FIG. 7. The transistor had a threshold voltage of 0.6 V and a $V_A$ of 40.8 V, where $V_A$ is defined as −1/$\lambda$ with $\lambda$ being the channel length modulation parameter. The output conductance of the transistor was 2.0×10$^{-5}$ $\Omega^{-1}$ for a gate voltage of 4 V. The threshold voltage did not shift following the micromechanical structural processing. The processing of the resonator should not affect the circuitry because there are no high temperature steps after circuit fabrication. In addition, the circuit is protected from all subsequent processing by an LTO layer.

The transimpedance amplifier was designed to detect the output motional current of the resonator, where the current is converted into an output voltage via multiplication with a shunt-shunt feedback MOS resistor. To insure good performance of the detection circuitry, the main amplifier block is comprised of the frequently used simple 5-transistor operational amplifier with a feedback resistor. The robustness and stability of the detection circuitry is enhanced by using a biasing scheme which allows the user to manually set the dc bias values at various nodes of the circuit. In order to minimize power consumption, the transistors in the amplifier block were designed to operate in the subthreshold regime with a bias tail current of <250 nA. Matching problems of transistors in the subthreshold regime are alleviated by designing transistors with large dimensions so that uniform transistor characteristics can be easily obtained. For a 0 to 5 V rail-to-rail supply and a bias current of 250 nA, the power dissipated by the amplifier was calculated to be ~1.25 $\mu$W. The simulated 3-dB frequency of the amplifier was 150 kHz.

Conclusions

A simple process has been developed for making a micromechanical device from a single crystal semiconductor using front-side release etch-diffusion. Also, this process has been expanded to integrate single crystal Si resonators as thick as 11 $\mu$m with conventional BiCMOS circuitry. The processing of the micromechanical structure adds only additional masking step to the baseline circuit process. If $SiO_2$ or photoresist is used as the etch mask for the micromechanical structure instead of the Ni etch mask, the merged process can be further simplified so that no additional masking steps are required. Micromechanical devices have been fabricated with a 500 $\mu$m long, 5 $\mu$m wide, 11 $\mu$m thick single crystal Si clamped-clamped beam resonator and a CMOS transimpedance amplifier on the same chip. A deep Si etch in a $Cl_2$ plasma generated in an ICP source has been optimized so that high aspect ratio comb gaps can be fabricated with smooth sidewalls. A resonance frequency of 28.85 kHz and a maximum amplitude of vibration of 4.6 $\mu$m at resonance was measured in air both optically and electrically using a network analyzer. A number of devices were tested and their resonance frequencies were uniform and close to that predicted by simple theory. Circuit characteristics of CMOS transistors were measured and the processing of the micromechanical resonator had no deleterious effects on the devices.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of making a micromechanical device from a single crystal semiconductor substrate, the method comprising:
    a) introducing a dopant into a portion of the substrate from a first surface;
    b) selectively removing unwanted substrate material from the first surface of the substrate wherein at least one doped mechanical structure is formed after performing steps a) and b); and
    c) selectively removing substrate material from the first surface of the semiconductor substrate to release the at least one doped mechanical structure wherein the at least one doped mechanical structure is movably supported by but electrically isolated from the semiconductor substrate.

2. The method as claimed in claim 1 wherein the at least one doped mechanical structure is a resonator.

3. The method as claimed in claim 1 further comprising the step of forming circuitry on the substrate.

4. The method as claimed in claim 3 wherein the circuitry is semiconductor circuitry.

5. A method of making a suspended microstructure from a single crystal semiconductor substrate, the method comprising:
    a) introducing a dopant into a region in the substrate;
    b) depositing a masking material over the region;
    c) selectively removing portions of the masking material to form a mask;
    d) selectively removing sections of the region using dry etching and the mask, wherein a doped microstructure is formed after performing steps a) through d);
    e) selectively removing substrate material from the semiconductor substrate with an etch which etches the semiconductor substrate but does not etch the doped microstructure, so that the doped microstructure is movably supported by but electrically isolated from the semiconductor substrate; and
    f) removing the masking material.

6. The method as claimed in claim 5 wherein step f) is performed before step e).

7. The method as claimed in claim 5, wherein steps b) through d) are performed before step a).

8. The method as claimed in claim 5 wherein the mask is a metal mask.

9. The method as claimed in claim 5 wherein the mask is a photoresist mask.

10. The method as claimed in claim 5 wherein the semiconductor is silicon and the mask is a silicon dioxide mask.

11. The method as claimed in claim 5 wherein the diffused doped region is greater than 7 $\mu$m thick and wherein the doped microstructure is also greater than 7 $\mu$m thick.

12. The method as claimed in claim 5 wherein the diffused doped region is less than 7 $\mu$m thick and wherein the doped microstructure is also less than 7 $\mu$m thick.

13. The method as claimed in claim 5 wherein the step of introducing the dopant forms an electrically isolating diode between the doped microstructure and the substrate.

14. The method as claimed in claim 5 further comprising:
    g) dry etching a trench around anchors of the doped microstructure; and
    h) refilling the trench with an insulating material to anchor the doped microstructure to the substrate and also to electrically isolate the doped microstructure from the substrate.

15. The method as claimed in claim 5 wherein the length of the etch of step e) is variable in order to increase or decrease the distance between the suspended doped microstructure and the substrate.

16. The method as claimed in claim 5 wherein the step of selectively removing sections of the region is performed in an electron cyclotron resonance source, an inductively coupled plasma source, or other plasma sources.

17. The method as claimed in claim 5 wherein the step of selectively removing material from the substrate is performed using ethylenediamine pyrocatechol.

18. The method as claimed in claim 5 wherein the step of selectively removing material from the substrate is performed using potassium hydroxide.

19. The method as claimed in claim 5 wherein the step of selectively removing material from the substrate is performed using tetramethyl ammonium hydroxide.

20. A method of making a suspended microstructure from a single crystal semiconductor substrate, the method comprising:

a) selectively removing unwanted substrate material from a first surface of the substrate;

b) introducing a dopant into a portion of the substrate from the first surface, wherein at least one doped mechanical structure and an open area surrounding the mechanical structure are formed after performing steps a) and b);

c) refilling the open area surrounding the mechanical structure with a material;

d) forming semiconductor circuitry on the substrate; and e) removing the material surrounding the mechanical structure wherein the at least one doped mechanical structure is movably supported by but electrically isolated from the substrate.

* * * * *